United States Patent [19]

Kumakura

[11] Patent Number: 5,412,337
[45] Date of Patent: May 2, 1995

[54] SEMICONDUCTOR DEVICE PROVIDING RELIABLE CONDUCTION TEST OF ALL TERMINALS

[75] Inventor: Sinsuke Kumakura, Kanagawa, Japan

[73] Assignee: Fujitsu Limited, Kawasaki, Japan

[21] Appl. No.: 297,717

[22] Filed: Aug. 30, 1994

Related U.S. Application Data

[63] Continuation of Ser. No. 181,161, Jan. 13, 1994, abandoned, which is a continuation of Ser. No. 35,880, Mar. 23, 1993, abandoned, which is a continuation of Ser. No. 777,049, Oct. 16, 1991, abandoned.

[30] Foreign Application Priority Data

Oct. 17, 1990 [JP] Japan .................. 2-276149

[51] Int. Cl.⁶ .............................................. H01L 25/00
[52] U.S. Cl. ................................ 327/566; 327/427; 327/537
[58] Field of Search .................. 307/303, 303.1, 303.2, 307/304, 443, 571, 572; 324/158 R, 73.1, 500, 537; 371/15.1, 22.5, 22.6

[56] References Cited

U.S. PATENT DOCUMENTS

| | | | |
|---|---|---|---|
| 4,743,841 | 5/1988 | Takeuchi | 324/158 R |
| 4,853,628 | 8/1989 | Gouldsberry et al. | 324/158 R |
| 4,894,605 | 1/1990 | Ringleb et al. | 324/537 |
| 4,914,379 | 4/1990 | Maeno | 371/22.5 |
| 4,937,826 | 6/1990 | Gheewala et al. | 371/15.1 |
| 4,952,824 | 8/1990 | Kamuro | 307/303.2 |
| 5,070,296 | 12/1991 | Priebe | 324/537 |
| 5,072,175 | 12/1991 | Marek | 324/537 |

FOREIGN PATENT DOCUMENTS

8402580 7/1984 WIPO .................. 371/22.5

*Primary Examiner*—Terry D. Cunningham
*Attorney, Agent, or Firm*—Nikaido, Marmelstein, Murray & Oram

[57] ABSTRACT

A semiconductor device is disclosed which is directed to drastically reduce a conduction test time by reliably executing the conduction test of all terminals in a lump. The invention discloses the semiconductor device including a first power supply terminal, a second power supply terminal having a lower potential than the first power supply terminal, an internal circuit portion to which the first and second power supply terminals are connected, and an input signal terminal group and an output signal terminal group each connected to the internal circuit portion, wherein a first voltage supply source and a second voltage supply source having a predetermined potential difference from the first voltage supply source are disposed, a switching device is interposed between the first and second voltage supply sources, and the switching device is turned ON and OFF in accordance with the existence of a voltage applied to each of the terminals described above.

14 Claims, 10 Drawing Sheets

SEMICONDUCTOR DEVICE PROVIDING RELIABLE CONDUCTION TEST OF ALL TERMINALS

This application is a continuation of application Ser. No. 08/181,161, filed on Jan. 13, 1994 now abandoned, which in turn is a continuation of application Ser. No. 08/035,880, filed Mar. 23, 1993, now abandoned, which in turn is a continuation of application Ser. No. 07/777,049, filed Oct. 16, 1991, now abandoned.

BACKGROUND OF THE INVENTION

1. Field of the Invention

This invention relates to a semiconductor device such as a memory, and more particularly to a semiconductor device which can easily and reliably carry out a conduction test.

2. Description of the Prior Art

A semiconductor memory is known as a typical example of semiconductor devices.

Figure 7:
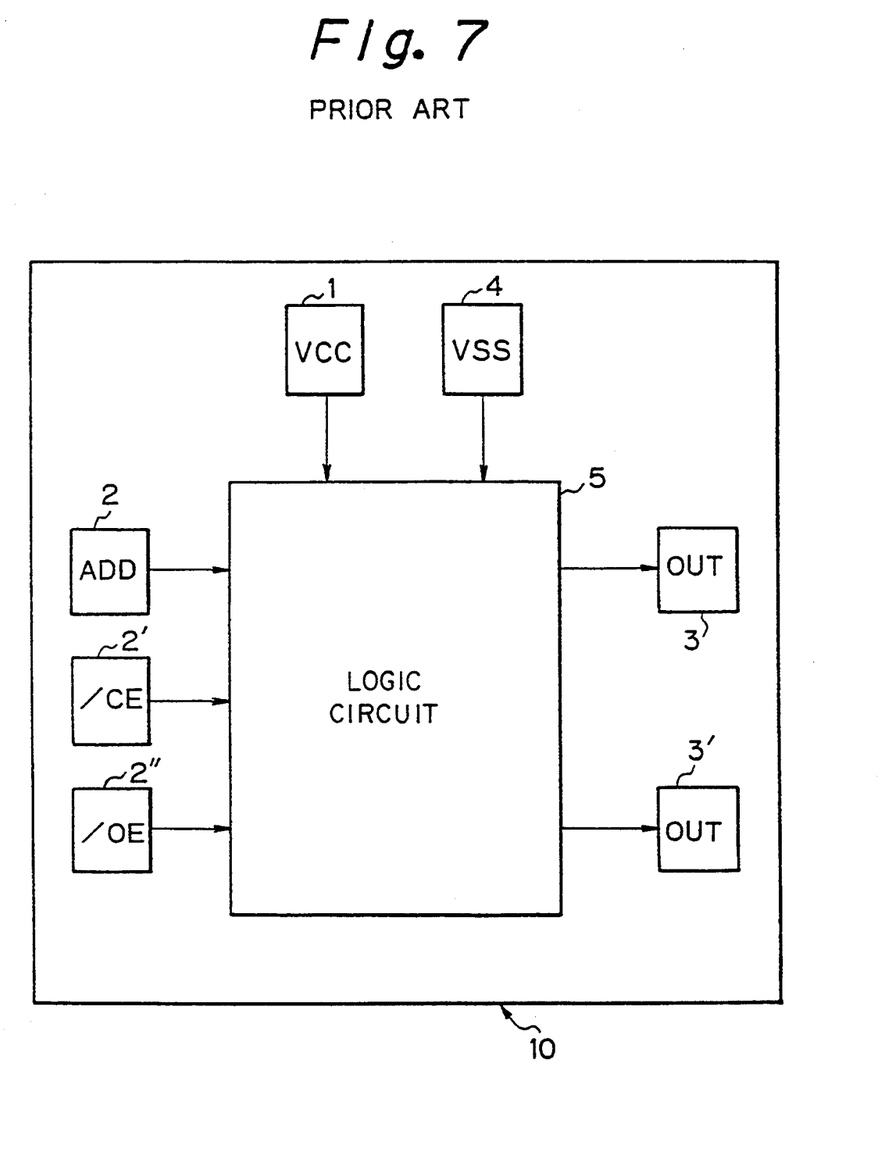
FIG. 7 is a wiring diagram showing an example of the structure of a conventional semiconductor device.

Generally, a semiconductor memory includes power supply terminals Vcc and Vss, an input signal terminal, an output signal terminal and an internal logic circuit. FIG. 7 of the accompanying drawings illustrates a general example. In this drawing, reference numeral 10 denotes a chip of a semiconductor memory. A logic circuit 5 is formed on this chip. A high voltage power supply Vcc terminal 1 and a low voltage power supply Vss terminal 4 are also disposed on the chip. Reference numerals 2 and 3 denote an input signal terminal and an output signal terminal, respectively. In this instance, a memory constituting an internal circuit outputs predetermined data to the output signal terminal 3 in accordance with the input signal applied to the input signal terminal 2 at a power supply voltage applied between the terminals 1 and 4 from outside.

Recently, test time has drastically increased in tests of semiconductor devices with the increase in memory capacity, and a test cost will become very high unless counter-measures are taken. To restrict the rise of the test cost, it is very important to discriminate as rapidly as possible rejected products. Furthermore, it is necessary to limit the increase of the test time by incorporating various specific test functions into the semiconductor devices so as to limit the rise of the test time.

The test items can be broadly classified into a DC test for checking a power supply current and an AC test for checking an access time, and the like. However, these performance guarantee tests are carried out on the assumption that all the terminals of the semiconductor devices to be tested (hereinafter referred to as the "devices") are in advance confirmed to have been reliably connected to the test terminals of a testing apparatus.

Unless the condition wherein all the terminals of the device are connected to the testing apparatus is guaranteed by this conduction test, performance of the device cannot be guaranteed even when the performance guarantee test is carried out. Conventionally, the following method has generally been employed in order to confirm that all the terminals of the device are reliably connected to the testing apparatus.

A diffusion layer made of an impurity having an opposite conductivity type to that of a substrate is connected to each terminal, and a diode is connected electrically. Therefore, the connection between the testing apparatus and the terminals of the device can be confirmed by forwardly biasing this diode. This test is repeated for each terminal of the device.

Speaking more definitely, various pins formed outside the device and connected to a pad portion of the device or in other words, its terminal portion, through leads, are brought into mechanical contact with a probe to be connected to these pins. Then, whether or not each pin is in complete contact with the probe is sequentially checked by use of a switching means disposed in the testing apparatus such as relay, and after all the pins are confirmed to be in perfect contact with the probe, the performance test of the device is commenced.

The time required for conducting such a conduction test has not been so long in the past because the number of terminals is not so great. Since the number of terminals has drastically increased in semi-conductor devices with the increase in their capacity in recent years, however, the time necessary for the conduction test has become longer and longer and has resulted in the increase of the test cost. Therefore, it has become very important to shorten the test time.

In other words, in the conduction test described above, the conduction test time increases in proportion to the number of terminals, and the test time will be ever-increasing unless measures are taken.

Therefore, a testing method which can efficiently conduct this conduction test has become essentially necessary.

SUMMARY OF THE INVENTION

It is therefore a primary object of the present invention to provide a semiconductor device which can eliminate the problems with the prior art described above, which can execute reliably the conduction test of all the terminals in a lump and can thus reduce drastically the conduction test time, and which can reduce the fabrication cost of the semiconductor device while maintaining performance.

In order to accomplish the object described above, the present invention employs the following technical structure. Namely, the present invention provides a semiconductor device which fundamentally comprises a first power supply terminal, a second power supply terminal having a lower potential than the first power supply terminal, an internal circuit portion to which both the first and second power supply terminals are connected, and an input signal terminal group and an output signal terminal group each of which is connected to the internal circuit portion, wherein a first voltage supply source and a second voltage supply source having a predetermined potential difference from the first voltage supply source are disposed either separately from each of the terminal groups or by using in common part of the terminal groups, a switching device is interposed between the first power supply source and the second voltage supply source, and this switching device is constituted in such a fashion as to be turned ON and OFF in accordance with the existence of a voltage applied to each of the terminals described above.

In the present invention, the semiconductor device has the structure as described above. Accordingly, when a voltage sufficient enough to turn ON the switching device is applied to each of the terminals of the semiconductor device to be tested, a current is normally to flow through a circuit formed between the first voltage supply source as a high voltage power supply and the second voltage supply source as a low voltage supply power supply. The conduction test is carried out by detecting whether or not the current flows through this circuit, and if it does, it is possible to judge that all the terminals are connected reliably to the predetermined terminals of the testing apparatus and are conductive.

If the current does not flow through the circuit described above, this means that one of the terminals are not reliably connected to the corresponding terminal or terminals of the testing apparatus.

DESCRIPTION OF THE PREFERRED EMBODIMENTS

Hereinafter, semiconductor devices of preferred embodiments in the present invention will be explained in detail with reference to the accompanying drawings.

Figure 1:
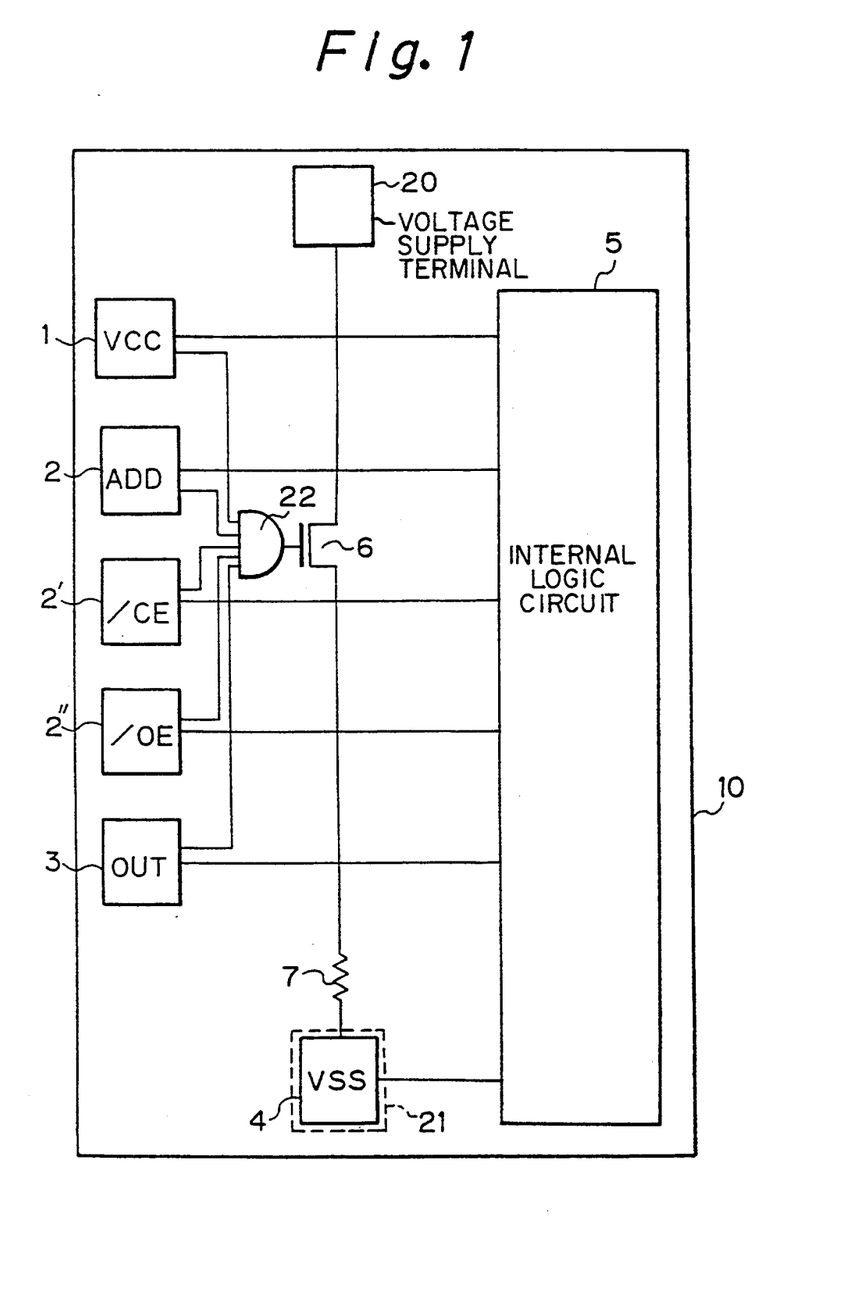
FIG. 1 is an explanatory view useful for explaining the principle of a semiconductor device according to the present invention, and showing an embodiment of the semiconductor device.

FIG. 1 shows a semiconductor device in an embodiment of the present invention, and is an explanatory view useful for explaining the principle of the present invention.

The semiconductor device in accordance with the present invention is a semiconductor device which fundamentally comprises a first power supply terminal 1 receiver a high voltage Vcc, a second power supply terminal 4 receiving a lower voltage Vss than the first power supply terminal Vcc, an internal logic circuit portion 5 to which both power supply terminals are connected, an input signal terminal group 2, 2', 2'' consisting of an address terminal ADD, a chip ENABLE terminal CE or an output ENABLE Bar terminal OE, etc., and an output signal terminal group 3, as shown in FIG. 1. In the semiconductor device 10 described above, the semiconductor device of the present invention is characterized in that the semiconductor device comprises a first power supply terminal 20 receiving a first high potential, a plurality of the signal input/output terminals 1 to 4, each connected to the internal circuit 5, a second power supply terminal 1 receiving a second high potential and connected to an internal circuit 5 to thereby serve as one of the signal input/output terminals 1 to 4, and a third power supply terminal 21, receiving a third potential which is lower than any one of the first and the second high potentials and connected to the internal circuit 5. In the present invention, the first power supply terminal 20 is connected to the third power supply terminal 21 to provide a test current path. Further, in the semiconductor device of the present invention, the first and the second power supply terminals 20 and 1 are disposed separately on a surface of the device and used independently. However, in a further embodiment, instead of having the first power supply terminal 20 and the second power supply terminal 1 utilized separately, the circuit may have the terminals used in common to effectively provide only one power supply terminal which will both provide power to the internal circuit and be connected to the third power supply terminal 21 to provide the test current path (as seen for example in FIG. 3).

In the semiconductor device of the present invention, the first voltage supply terminal 20 and the second voltage supply terminal 21 for supplying a voltage lower than the voltage of the first voltage supply source can be disposed separately from the terminals 1 to 4 that are ordinarily disposed in semiconductor devices, but also be commonly disposed therewith. Both of the voltage supply terminals are connected to form a current path, the current switching device 6 is interposed in this current path and this switching device 6 is so arranged as to turn ON the current path only when all the probes of the testing apparatus described already are brought into contact with all the terminals and generate predetermined voltages and to turn OFF the current path at other times, in order to make it possible to instantaneously check whether or not each pad of the semiconductor device to be checked, or each of the terminal groups described above, is in reliable contact with each probe of the testing apparatus, as the precondition for efficiently carrying out the afore-mentioned performance test.

In other words, in order to confirm the contact of each probe with each terminal of the device, the first voltage supply terminal 20 and the second voltage supply terminal 21 are connected in such a manner as to define the current path between them, and the switching device 6 which turns ON the current path when the probes are brought into contact with all the terminal portions is disposed in the current path. Accordingly, when the probes are brought into contact with all the terminal portions, a predetermined current flows from the first voltage supply terminal 20 to the second voltage supply terminal 21, and whether or not each terminal is completely connected with the probe can be judged by detecting this flowing current by appropriate current detection means.

If any one of the terminals has a poor contact with the probe or is not connected, the current does not naturally flow, so that the test of the semiconductor device is stopped and the connection state is confirmed once again.

In such a case, the circuit inside the current path may be defective, at times. If this is the case, the semiconductor device is excluded as a rejected product from the inspection process.

The first voltage supply terminal 20 in the present invention can be disposed separately from various terminals and pads that are disposed in the conventional semiconductor devices.

The first voltage supply terminal 20 described above may be constituted so as to apply a voltage sufficient enough to let the current flow through the current path during the test of the semiconductor device. More definitely, a predetermined voltage is applied by the use of an appropriate probe of the testing apparatus described above.

The voltage applied to the first voltage supply source need not always be the same as the voltage of the first power supply Vcc, but may be below 5 V, for example.

In the present invention, the first voltage supply terminal 20 may be used in common with the first power supply terminal (Vcc) 1. Therefore, it is possible to combine these terminals into one terminal.

When the first voltage supply terminal 20 and the first power supply terminal (Vcc) 1 are disposed separately, the contact state between the first power supply terminal (Vcc) 1 and the corresponding probe can be judged, too.

When the first voltage supply terminal 20 is used in common with the first power supply terminal (Vcc) 1, the current does not flow, of course, through the current path when the probe is not connected to the first power supply terminal (Vcc) 1.

On the other hand, since the current must flow through the current path, the second voltage supply terminal 21 is preferably the power supply having the lowest potential in the circuit of the semiconductor device 10 to be tested. However, in a further embodiment, instead of having the first power supply terminal 20 and the second power supply terminal 1 utilized separately, the circuit may have the terminals used in common to effectively provide only one power supply terminal which will both provide power to the internal circuit and be connected to the third power supply terminal 21 to provide the test current path (as seen for example in FIG. 3).

The structure of the switching device 6 interposed in the current path in the present invention is not particularly limited. However, it must be constituted in such a manner so as not to operate at a voltage at which the semiconductor device 10 to be tested is generally operated. In other words, the switching device 6 is preferably constituted so as not to operate unless a voltage of at least 7 V and preferably from about 10 to 15 V is applied thereto.

The switching device is preferably composed of an MOSFET, for example, and is more preferably composed of an n-channel MOSFET.

When the probes are brought into reliable contact with the terminals 1 to 4, particularly with the terminals 1 to 3 and when a predetermined voltage is applied from each probe to the corresponding terminal, the switching device 6 turns ON the current path and allows the predetermined current to flow through the current path. As a definite example, an AND circuit 22 for inputting the outputs of the terminals 1 to 3 is disposed as shown in FIG. 1 and the output of this AND circuit 22 is connected to the input of the switching device 6.

When the switching device 6 is composed of the n-channel MOSFET, the output of the AND circuit described above is connected to the gate of this transistor.

In such a case, a predetermined voltage such as a voltage of at least 7 V is applied through the probe to each of the terminals 1 to 3, and a voltage of at least 7 V is output from each terminal, so that a voltage of at least 7 V is preferably output from the AND circuit.

On the other hand, the switching device 6 is constituted so as not to operate at a voltage of 5 V or below, as described above. Accordingly, when any one of the terminals is not sufficiently connected with the probe, the predetermined voltage is not output from the AND circuit and the switching device 6 is not conductive. Accordingly, the current path remains OFF. When all the terminals 1 to 3 are completely connected with the probes, however, the predetermined voltage is output from the AND circuit and hence, the switching device 6 becomes conductive and the current path is turned ON.

Figure 2:
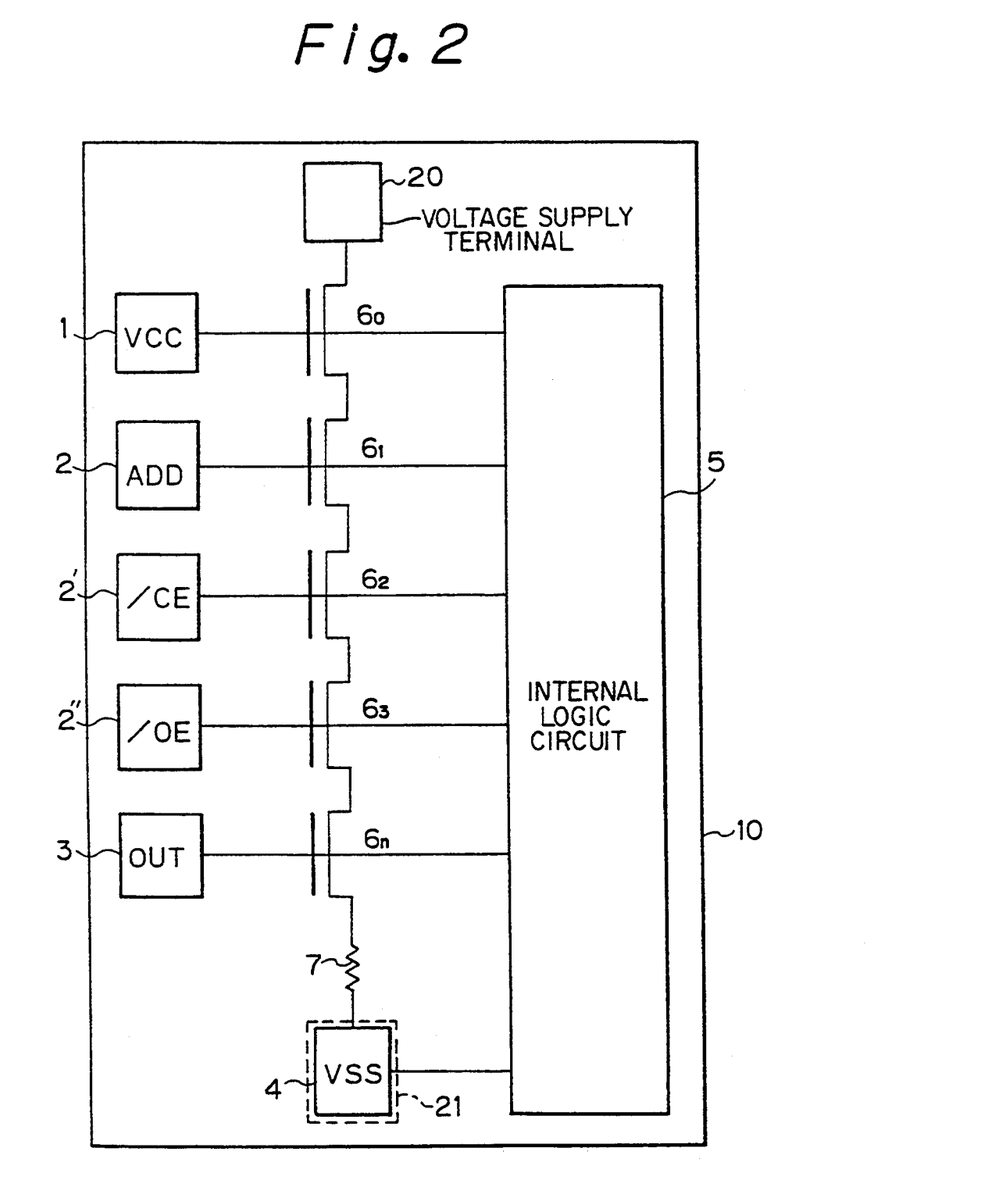
FIG. 2 is a wiring diagram showing the semi-conductor device of another embodiment of the present invention.

FIG. 2 shows another definite example of the semiconductor device of the present invention. In this embodiment, switching devices $6_0$–$6_n$ are disposed in place of the AND circuit in such a manner as to correspond to the terminals 1 to 3, respectively, and these switching devices are connected in series with one another and the series circuit is interposed between the first voltage supply terminal 20 and the second voltage supply source 21. Moreover, these switching devices $6_0$–$6_n$ disposed so as to correspond to the terminals are constituted so as to become conductive and non-conductive in accordance with the existence of the voltages applied to these terminals.

Next, the embodiment will be described in further detail.

In other words, in this embodiment, the switching devices $6_0$, $6_1$, $6_2$, $6_3$, $6_4$ which are turned ON and OFF in accordance with the voltages applied to the terminals are disposed at part, or preferably the whole, of the first power supply terminal 1, input signal terminal group 2, 2′, 2″ and output signal group 3, and these switching devices $6_0$ to $6_4$ are connected in series with one another. One of the ends of the series circuit thus formed is connected to the first voltage supply source 20 and the other end, to the second power voltage source 21.

In this embodiment, the group of the switching devices $6_0$, $6_1$, $6_2$, $6_3$, $6_4$ connected in series between the first voltage supply source 20 and the second voltage supply source 21 constitute the conduction test circuit. In the present invention, a resistor 7 is inserted into part of the conduction test circuit constituted by the group of the switching devices connected in series, so that the current flowing through the conduction test circuit can be measured.

In the present invention, the switching devices $6_0$, $6_1$, $6_2$, $6_3$, $6_4$ may be constituted by those devices which become conductive when a predetermined voltage such as a voltage higher than the first power supply Vcc, for example, is applied. If all the terminals of the semiconductor device to be measured are reliably connected to the predetermined terminals of the testing apparatus during the conduction test, all the switching devices disposed at all the terminals become conductive when the predetermined voltages are applied to the terminals, and the current flows through the current path between the first voltage supply terminal 20 and the second voltage supply terminal 21.

The conduction test can be executed by measuring the current described above by a suitable ammeter.

Though the switching devices may be disposed at at least part of the terminals of the semiconductor device to be measured, they are more preferably disposed at all the terminals of the semiconductor device.

The switching device in the present invention is not particularly limited and the field effect transistor (FET) can be preferably used. More preferably, an MISFET transistor can be used as the switching device.

The MISFET used as the switching device may have the same structure as the MISFET used for the internal logic circuit of the semiconductor device.

Preferably, the switching device in the present invention has a threshold value such that the device becomes conductive only when a voltage higher than the potential of the first power supply terminal is applied thereto. When the transistor described above is used, the threshold value of the transistor is preferably high and in the case of the MISFET, for example, it preferably has a threshold voltage of at least 5 V and definitely, at least 7 V, for example.

When the conduction test is carried out in the present invention, a voltage of at least 7 V is applied to all the terminals of the semiconductor device to be measured or n other words, to the gates of the transistors as the switching devices, so that all the switching devices become conductive and the circuit between the first voltage supply terminal 20 and the second voltage supply terminal 21 is opened and permits the current to flow therethrough.

The conduction test circuit consisting of the switching devices is integrally fabricated during the fabrication of the semiconductor device, either simultaneously or with a time lag. Since the switching devices each have a high threshold value as described above, however, a user cannot know the existence of the switching devices even when the user uses the semi-conductor device, and the existence itself of the switching devices does not at all affect the performance and functions of the semiconductor device.

Each of the terminal portions shown in FIGS. 1 and 2 represent the pad.

Figure 3:
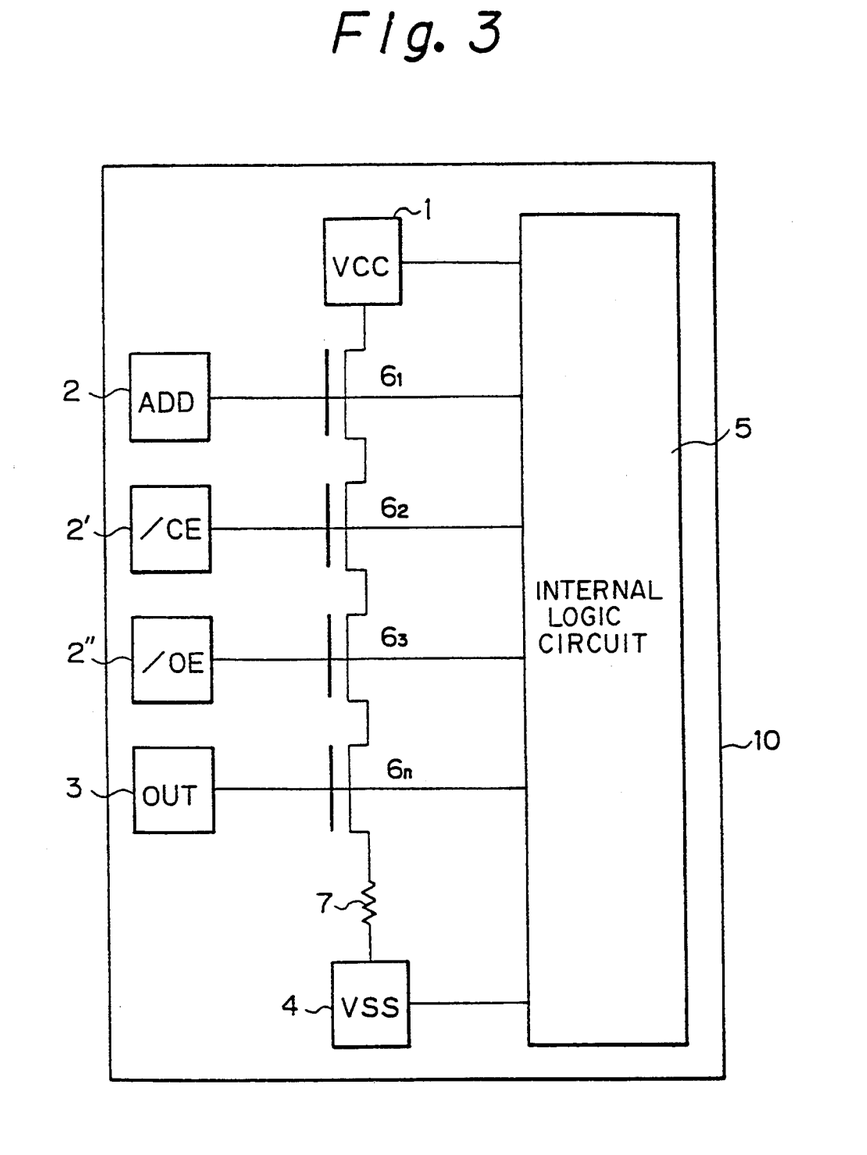
FIG. 3 is a wiring diagram showing the semi-conductor device of still another embodiment of the present invention.

FIG. 3 shows another definite example of the semiconductor device in another embodiment of the invention.

FIG. 3 shows an application example of the embodiment shown in FIG. 2. In this embodiment, the first voltage supply terminal 20 is used in common with the first power supply terminal (Vcc) 1. Since the operation of this embodiment is the same as that of the embodiment shown in FIG. 2, its detailed explanation will be omitted.

Figure 4:
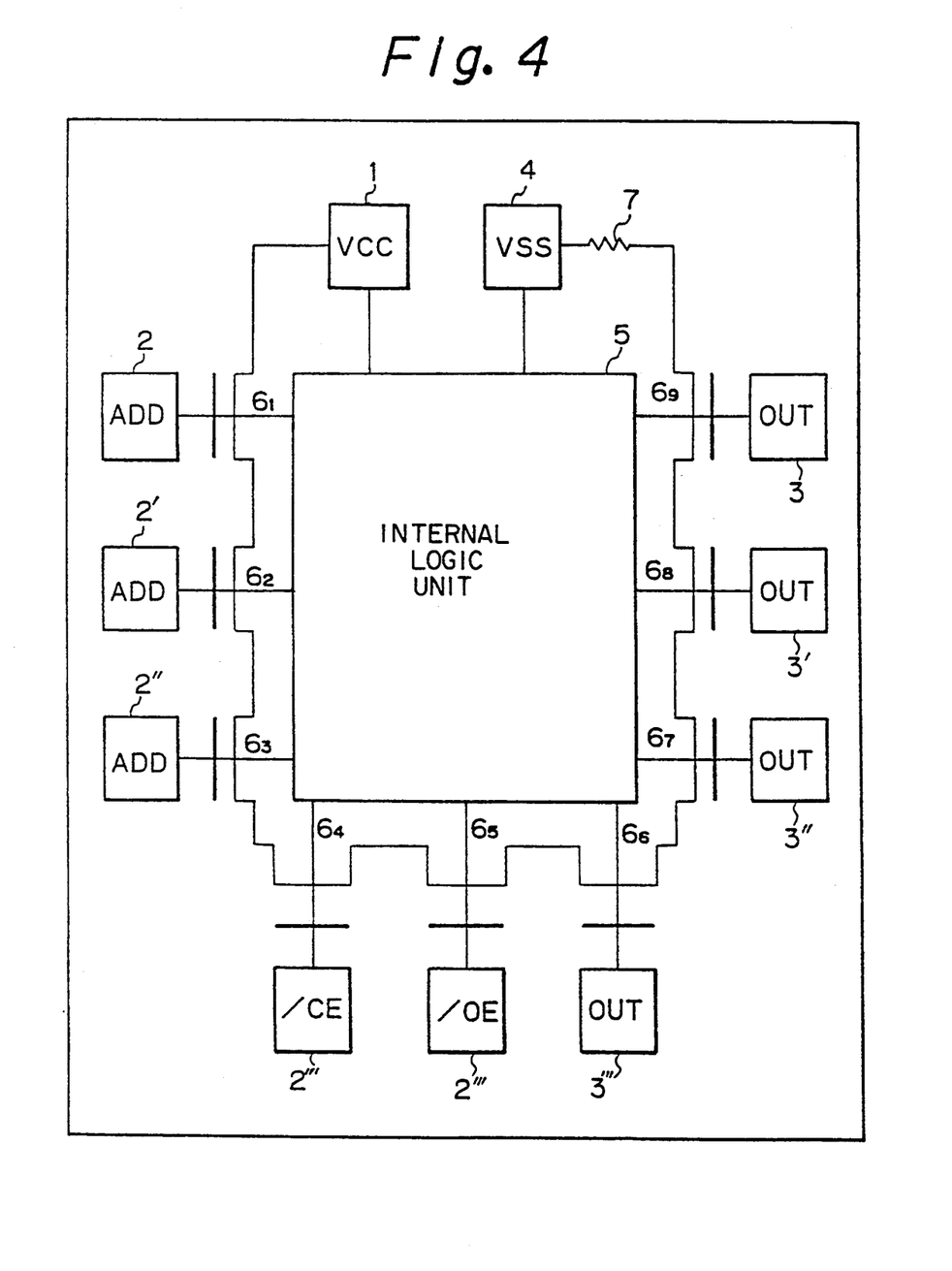
FIG. 4 is a wiring diagram showing the semi-conductor device of still another embodiment of the present invention.

FIG. 4 shows another definite example of the semiconductor device of the present invention. In this embodiment, the first and second voltage supply sources in the embodiment shown in FIG. 1 are composed of the first power supply terminal (Vcc) 1 and the second power supply terminal (Vss) 4, respectively.

In FIG. 4, reference numeral 1 denotes the first power supply terminal Vcc; 2, 2', 2'', 2''', ... are input signal terminal groups; 3, 3', 3''', ... are output signal terminal groups; 4 is the second power supply terminal Vss; 5 is the internal circuit; $6_1$–$6_9$ are switching device groups consisting of MOSFETs, for example; and 7 is the resistor device that connects the power supply terminals 1 to 4.

As described above, when the signals that render the switching devices $6_1$–$6_9$ consisting of MOSFETs conductive are applied to the input-output signal terminals, respectively, the current flows between the power supply terminal Vcc 1 and the power supply terminal Vss 4 through the resistor device 7.

At this time, the memory as the internal circuit 5 is constituted so as to output data in accordance with the input signal at the power supply voltage Vcc supplied from outside. At this time, a switching device having a threshold value of at least 7 V is used as the switching device 6.

This is to prevent a current from flowing between the power supply terminals 1 and 4 even when the input-output signals are applied under the normal state of use, and to permit the current to flow between the power terminals 1 and 4 only when a high voltage is applied to all the terminals. This switching device 6 can be easily accomplished by fabricating the FET transistor having a structure shown in FIG. 5, for example, by utilizing the thick oxide film disposed below each pad.

Figure 5A:
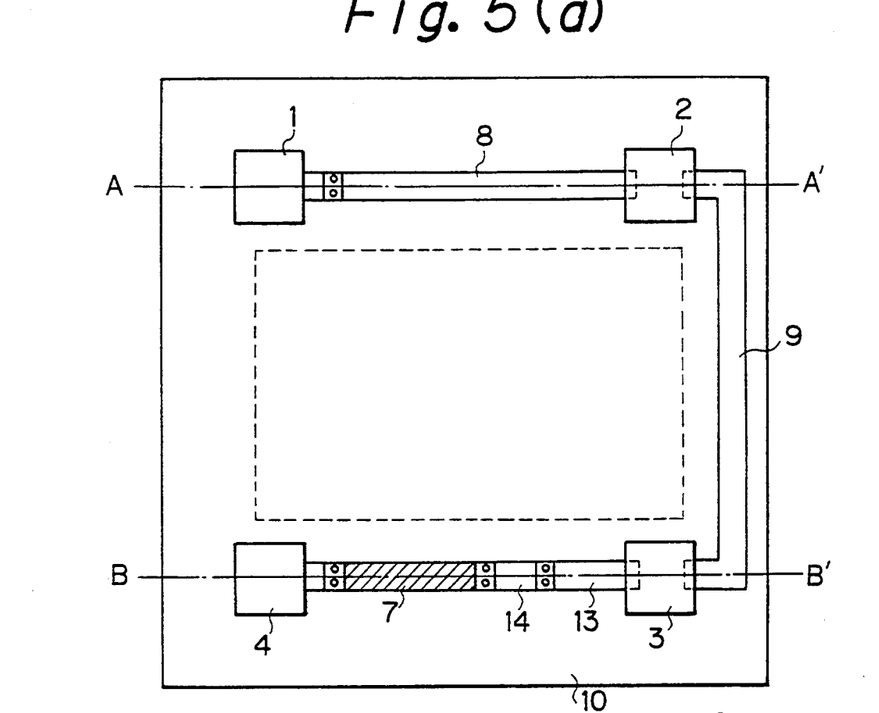
FIGS. 5(a)-5(c) are sectional view showing the structure of a switching device used in the present invention.
Figure 5B:
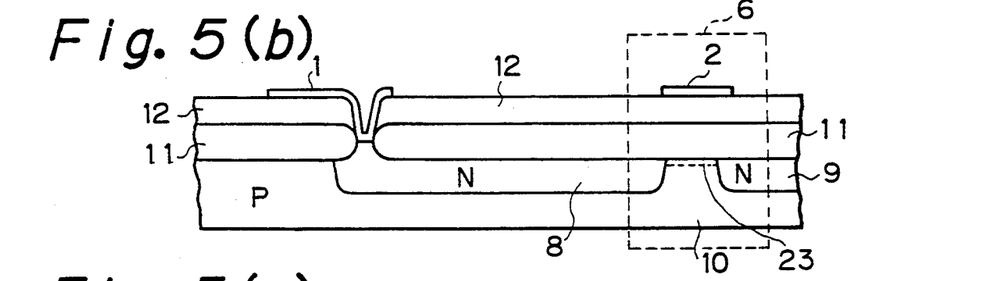
Figure 5C:
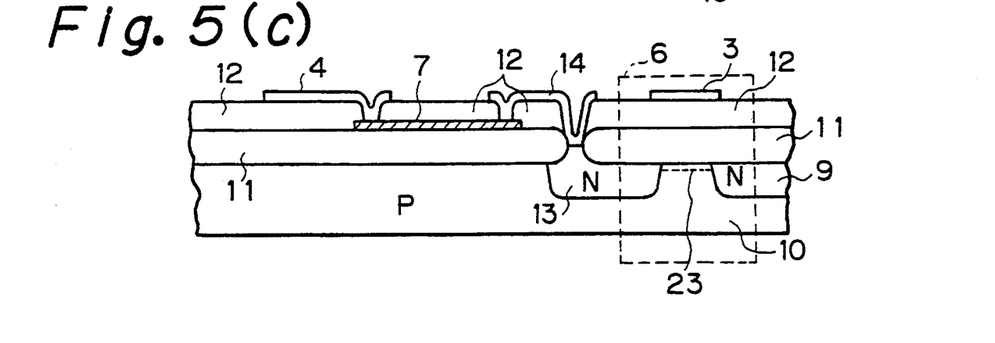

FIG. 5 is a sectional view of an MOSFET as an example of the switching device 6 having a high threshold value. FIG. 5(a) is a top view, FIG. 5(b) is a sectional view taken along line A-A' and FIG. 5(c) is a sectional view taken along line B-B'. Here, reference numeral 10 denotes a P-type Si substrate; 1 is the power supply terminal (Vcc) pad made of Al; 2 is the input signal terminal pad; 3 is the output signal terminal pad; 4 is the power supply terminal (Vss) pad; and 5 is the internal circuit. Reference numeral 7 denotes a polycrystalline Si functioning as the resistor device, for example; 8, 9 and 13 are N-type well regions; 10 is P-type substrate, 11 is a thick oxide film such as $SiO_2$ for device isolation; 12 is an inter-level insulating film such as PSG; and 14 is an aluminum wiring for connecting the N-type well region 13 to the resistor device 7.

In the sectional view of FIG. 5(b) along line A-A', the input signal terminal 2 of the switching device 6 having a high threshold value is the gate of the aluminum pad. The N-type region 8 functions as the drain, the N-type region 9 functions as the source and the thick oxide film 11 for device isolation functions as a gate oxide film.

Similarly, in the sectional view of FIG. 5(c) along line B-B', the output signal terminal 3 of the switching device 6' having a high threshold value is the gate of the aluminum pad. The N-type region 9 functions as the drain, the N-type region 13, as the source, and the thick oxide film 11 for device isolation, as the gate oxide film.

In each of the switching devices $6_0$–$6_n$ of the semiconductor device of the present invention, when a high voltage is applied to each terminal portion or in other words, to each pad portion 1–4, a channel 23 is formed between the N-wells 8 and 9 or between the N-wells 13 and 9, so that the current is allowed to flow.

Figure 6:
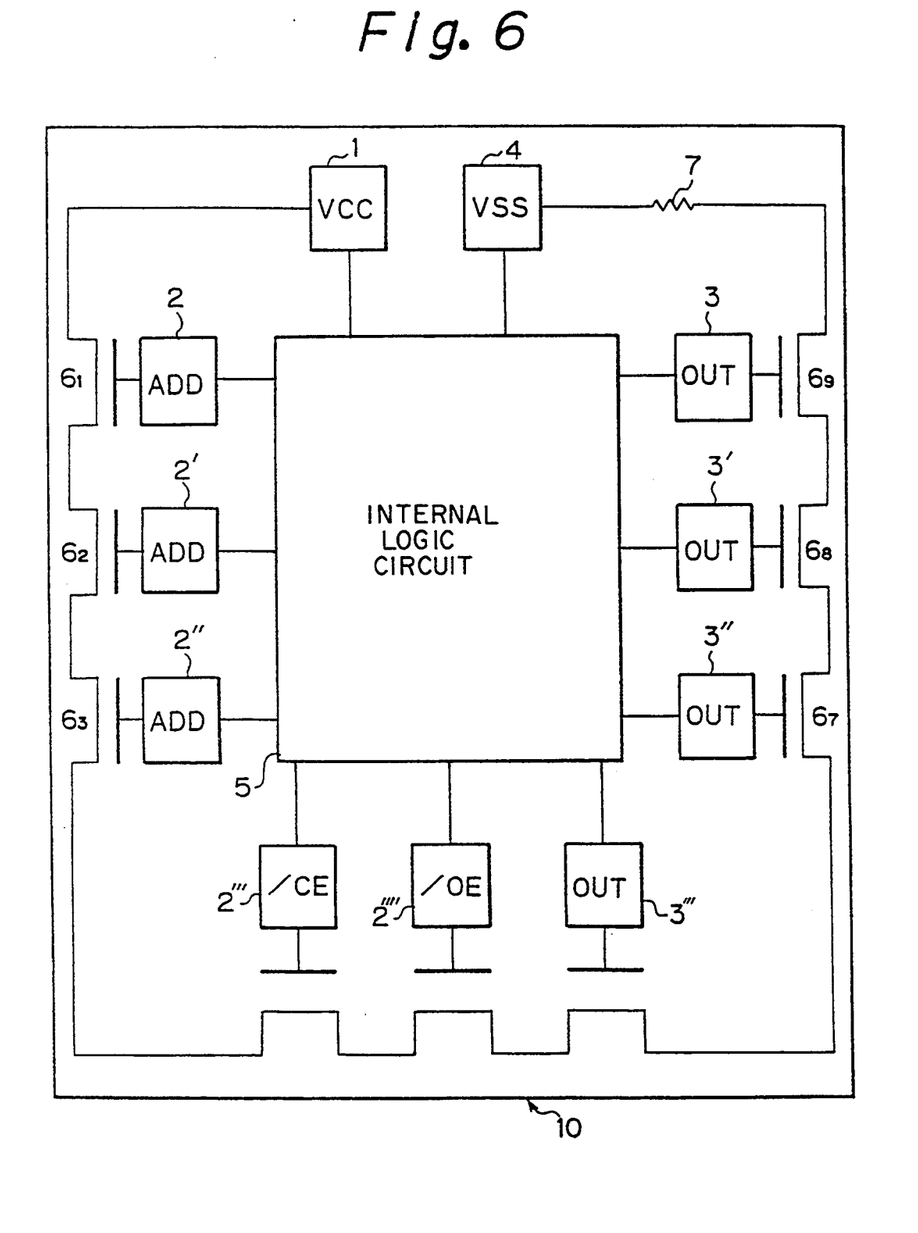
FIG. 6 is a wiring diagram showing the semi-conductor device of still another embodiment of the present invention.

FIG. 6 shows the semiconductor device in another embodiment of the present invention, which is fundamentally the same as the semiconductor device shown in FIG. 4. In the semiconductor device shown in FIG. 6, an active region is disposed at the periphery of the chip so as to take out the gate from each pad terminal without directly disposing the MOSFET having a high threshold value below the pad.

In other words, the switching devices $6_0$, $6_1$, $6_2$, $6_3$, ..., $6_9$ are formed at the outer peripheral portions of the chip and are connected in series with one another. Both ends of the series circuit thus formed are connected to the first and second power supplies, respectively, and the gate of each switching device is connected to each terminal corresponding thereto.

When a high voltage is applied to each terminal while all the input-output terminals are under the contact state, all the switching devices 6 become conductive and the current flows between the voltage supply terminals 20 and 21 or between the power supply terminals 1 and 4. In this way, it is possible to instantaneously judge that all the input-output terminals of the semiconductor device are reliably connected to the semiconductor device testing apparatus. If any one of the terminals is out of contact, the switching device 6 connected to that terminal becomes non-conductive and hence, the current does not flow between the power supply terminals 1 and 4. When this semiconductor device conduction testing circuit is used, the test time of the conduction test that has conventionally required a long time can be drastically reduced.

As described above, when the semiconductor device to be measured is subjected to the conduction test, the present invention eliminates the necessity for carrying out the conduction test for each of all the terminals. Accordingly, the present invention can greatly reduce the test time of the conduction test which has conventionally increased in proportion to the number of the terminals of the device to be measured.

Next, another embodiment of the semiconductor device of the present invention will be explained.

Figure 8:
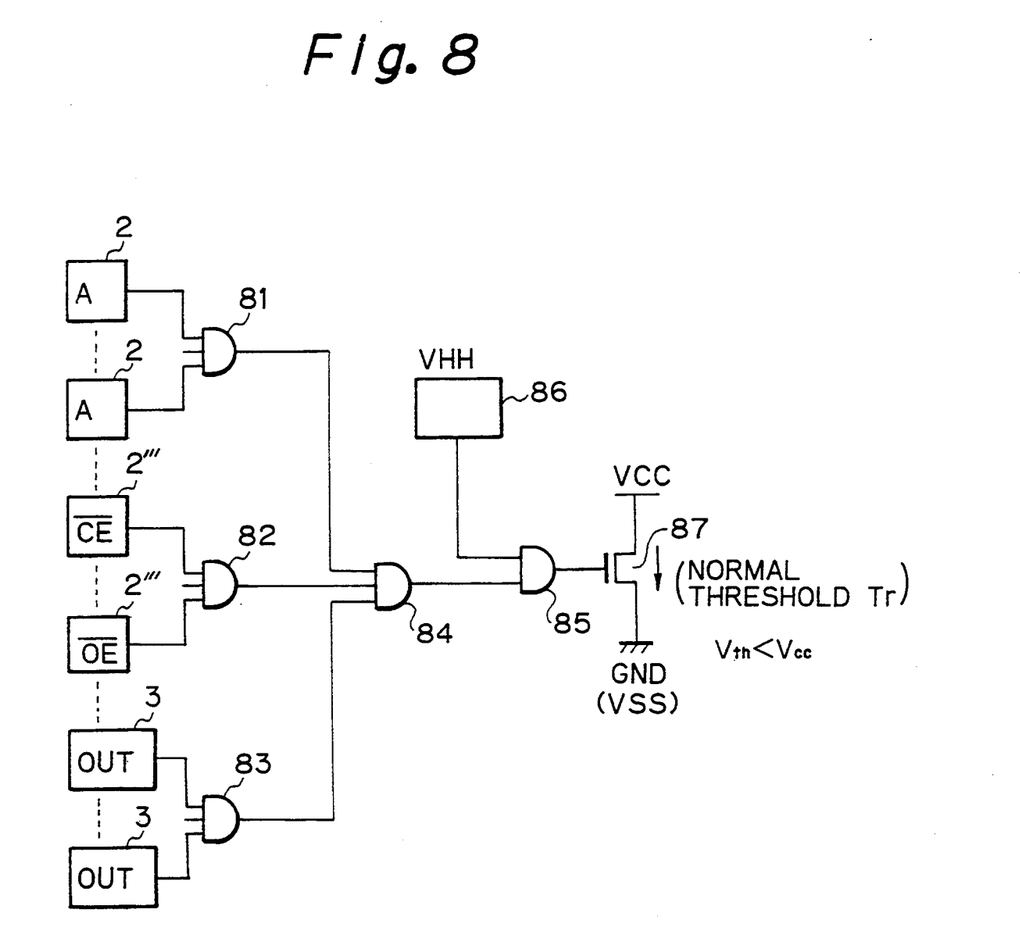
FIGS. 8 and 9 are other embodiments of the present invention.

FIG. 8 shows another embodiment of the conduction testing circuit of the semiconductor device. In the embodiment of FIG. 4, each of the power supply terminals 1, 4, input terminals 2, 2', 2", . . . and output terminals 3, 3', 3", . . . are directly connected to the gate electrode of each MISFET 61, 62, 63 . . . having a high threshold value. In this embodiment, however, a plurality of address terminals (ADD) 2, for example, among the input-output terminals are altogether connected to one AND gate circuit 81, a plurality of chip enable terminals ($\overline{CE}$) 2''' or a plurality of output enable terminals ($\overline{OE}$) 2'''' are connected to another AND gate circuit 82, and furthermore, a plurality of output terminals 3 are connected to still another AND gate circuit 83. The outputs of these AND gate circuits 81–83 are connected to the inputs of an AND gate circuit 84. The output of this AND gate circuit 84 is connected to one of the inputs of a two-input AND gate circuit 85, and the output of a test signal input circuit 86, which generates a high voltage power supply VHH only at the time of the conduction test, is connected to the other input of the two-input AND gate circuit 85. The output of the AND gate circuit 85 is connected to the gate of the MISFET 87, interposed between the first voltage supply source Vcc and the second voltage supply source Vss. This MISFET 87 has a high threshold value. When a signal having a voltage higher than this threshold value is applied to the gate of the MISFET 87 through the output of the AND gate 85, this transistor 87 is turned ON and a current is permitted to flow between the first and second voltage supply sources.

In this case, the voltage VHH of the test signal input circuit 86 is utilized as the output of the AND gate circuit 85.

In the circuit having the construction described above, the AND gate 85 may have a level conversion function or may be constituted so as to output a voltage higher than the threshold value of the MISFET 87 to each input.

Only when the input to the terminals are all at the "H" level and the test signal input circuit 86 outputs a voltage high enough to turn ON the MISFET having a high threshold value, the gate input of the MISFET 87 directly connecting the first voltage supply source Vcc to the second voltage supply source Vss rises to the high voltage VHH level due to the output from the AND gate circuit 85 in the form of the AND relationship. According to this construction, even when all the terminals are at the "H" level under the state of normal use, the voltage is not converted to a high voltage by the level conversion circuit described above unless the output of the test signal input terminal is a voltage high enough to turn ON the MISFET having a high threshold value. Accordingly, the gate input of the MISFET directly connecting the first and second voltage supply sources to each other rises only to the "H" level (or in other words, it does not rise to the high voltage VHH) even in the form of their AND relationship. Since the threshold value of this MISFET is in advance set to a high value, the MISFET directly connecting the first and second voltage supply sources is not turned ON and hence, this conduction test circuit does not operate.

Figure 9:
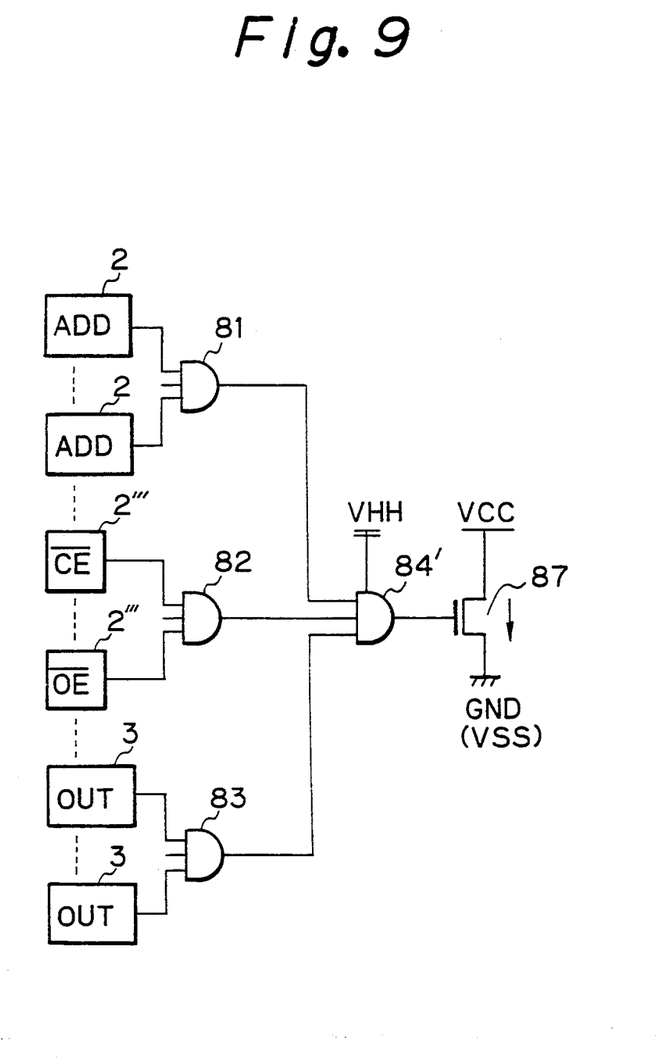

FIG. 9 shows still another embodiment of the conduction test circuit for the semiconductor devices.

In this embodiment, the test signal input circuit 86 and the AND circuit 85 in the embodiment shown in FIG. 8 are omitted, but a detection circuit for detecting a high voltage VHH (7 V or above) for the test signal is disposed in the AND gate circuit 84', in order either to input the signal to one of the inputs of this AND gate circuit or to operate the trigger circuit of the AND gate circuit 84'.

The MISFET 87 used in this embodiment is not the MISFET having a high threshold value such as the one used in FIGS. 1 to 4 and 8, but is a MISFET having an ordinary threshold value.

According to the circuit construction described above, the gate input of the MISFET 87 directly connecting the first voltage supply source to the second voltage supply source rises to the "H" level due to AND of each input signal only when the input of the terminals other than the terminals for impressing the high voltage VHH for the test signal are at the "H" level and a high voltage is applied to this high voltage VHH impression terminal for impressing the test signal. Consequently, the current flows from the first voltage supply source to the second voltage supply source. According to this construction, even when all the terminals rise to the "H" level during the state of normal use, this conduction test circuit does not operate unless a high voltage is applied to the VHH impression terminal for the test signal.

Since an MISFET whose threshold value is not high needs to be prepared in this embodiment, the circuit can be constituted by MISFETs having an ordinary threshold value, inclusive of the MISFET for connecting the first voltage supply source to the second voltage supply source.

An example of the method of conducting the conduction test by the use of the semiconductor device in accordance with the present invention will be hereinafter explained.

Figure 10:
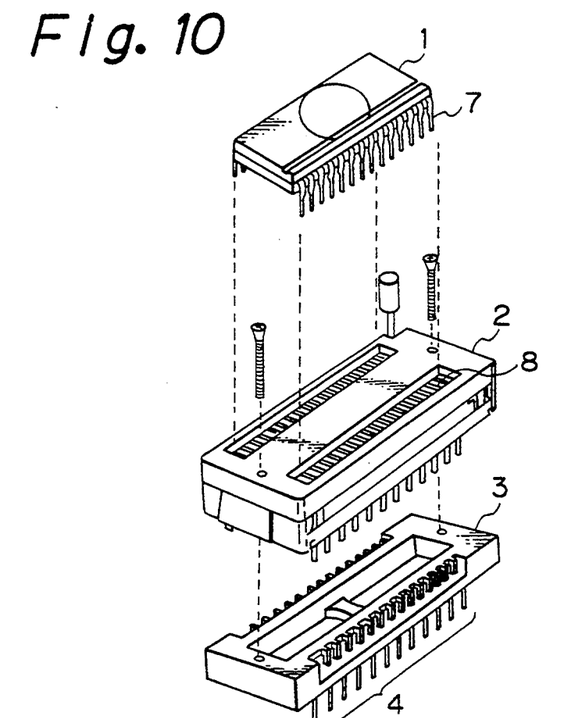
FIG. 10 shows a connecting condition between the semiconductor device to be tested and an IC socket of the testing device.

In FIG. 10, reference numeral 1 denotes a semi-conductor device to be tested; 2 is an IC socket provided to the measuring equipment; and 3 is a device for connecting the IC socket 2 to the semiconductor testing equipment 5, which is referred to a "receptacle". The IC socket 2 is plugged into the receptacle 3 and is fixed by a screw, or the like, in use. Service life of the IC socket 2 in the IC socket 2 runs out after repetition of insertion and removal of the semiconductor memory device 1 of tens of thousands of times. In other words, the IC socket 2 must be exchanged whenever tens of thousands of semiconductor memory devices 1 are tested.

When the semiconductor memory devices 1 in general are tested, the lead portion 7 of the semiconductor device 1 are inserted into the IC socket 2 and the terminals 4 of the receptacle 3 as the external terminals are wired to the semiconductor testing equipment 5 for connection through the receptacle 3. According to this construction, the semiconductor memory device 1 is fitted into the IC socket 2 during the test of the semiconductor memory device 1 to classify approved products. After the test is completed, the semiconductor memory device 1 is pulled out from the IC socket 2, and the semiconductor memory device 1 is classified as an approved product or a rejected product in accordance with this test result. Similarly, the next semiconductor memory device 1' is fitted into the IC socket 2 so as to conduct the classification. After the test is completed, the semiconductor memory device 1' is pulled out from the IC socket 2 and is classified as an approved product or a rejected product in accordance with the test result. Thereafter, the same procedure is repeated to conduct the test.

Figure 11:
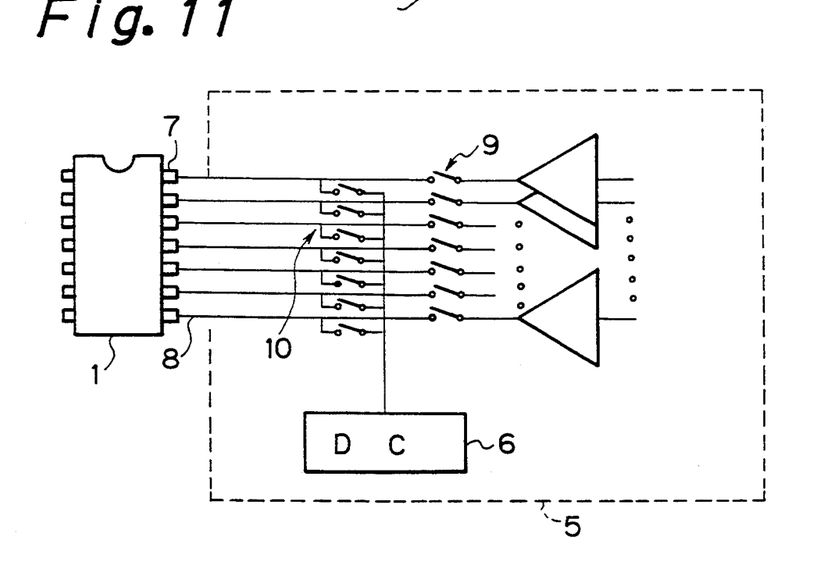
FIG. 11 shows a circuit diagram of the testing device.

FIG. 11 shows an example of the testing circuit. In FIG. 11, reference numeral 1 denotes the semi-conductor memory device and 5 semiconductor testing equipment. When the semiconductor memory device is to be tested in this drawing, whether or not each external terminal of the semiconductor memory device 1 (each pad in the case of the probe test) is reliably connected with each terminal 8 (each probe in the probe test) is first confirmed, and then the test is carried out. One of the methods of confirming reliable contact between them in this case is to measure a current flowing through the lead portion 7 or pad of the semiconductor device 1 to be tested by the use of a DC unit 6. If the external lead terminal 7 of the semiconductor memory device 1 is not in contact with the probe 8 of the IC socket 2 for some reason or other, the electric circuit is open, so that the current measured by the DC unit 6 is zero. When the external lead terminal 7 of the semiconductor memory device 1 is in reliable contact with the probe 8 of the IC socket 2, the current flowing through the circuit is measured in the DC unit 6. In this way, the connection with the semiconductor testing equipment 5 is confirmed by repeating ON/OFF the number of times corresponding to the number of external lead terminals 7 for each external lead terminal 7 of the semiconductor memory device 1.

I claim:

1. A semiconductor device including an internal circuit, a first power supply terminal receiving a first high potential, a second power supply terminal receiving a second high potential and connected to said internal circuit to serve as a high potential power supply terminal thereof, a third power supply terminal receiving a third potential which is lower than any one of said first and second high potentials and connected to said internal circuit to serve as a low potential power supply terminal thereof and signal terminals including a group of input terminals and a group of output terminals each connected to said internal circuit, wherein said first power supply terminal is connected to said third power supply terminal by at least one switching device and a resistance is placed therebetween, and said switching device is connected to a plurality of terminals selected from said group of input signal terminals, said group of output signal terminals and said second power supply terminal so that said switching device can only be turned ON when all of said selected terminals are simultaneously brought into contact with a plurality of test probes, corresponding to each one of said selected terminals.

2. A semiconductor device according to claim 1, wherein, when said switching device is turned ON, an electric current to be detected flows from said first power supply terminal to said third power supply terminal through said switching device and said resistance.

3. A semiconductor device according to claim 1, wherein said switching device is controlled by a processing circuit connected to said plurality of terminals selected from said group of input signal terminals, said group of output signal terminals and said second power supply terminal, said processing circuit processing data representing the existence of said potential at each of said selected terminals and outputting a control signal for controlling said switching device when all of said selected terminals output said potential, simultaneously.

4. A semiconductor device according to claim 3, wherein said processing circuit comprises an AND gate circuit, having each of said terminals selected from said group of input signal terminals, said group of output terminals and said second power supply terminal connected to a respective input terminal thereof.

5. A semiconductor device according to claim 2, wherein said switching device comprises a MOSFET.

6. A semiconductor device according to claim 1, wherein said at least one switching device comprises a plurality of switching devices provided between said first power supply terminal and said third power supply terminal, each of which are serially arranged with respect to each other.

7. A semiconductor device according to claim 6, wherein each of, said switching devices is connected to a respective one of said terminals selected from said input and output signal terminals and said second power supply terminal and controlled in accordance with the existence of said potential applied to each terminal.

8. A semiconductor device according to claim 2, wherein said current flowing from said first power supply terminal to said third power supply terminal through said switching device and said resistance is detected by a conduction test means when test probes are connected to said at least one switching device.

9. A semiconductor device according to claim 8, wherein said conduction test means comprises an ammeter or a DC unit connected between said first power supply terminal and said third power supply terminal.

10. A semiconductor device including an internal circuit, a first power supply terminal receiving a high potential and connected to said internal circuit to serve as a high potential power supply terminal thereof, a second power supply terminal receiving a low potential and connected to said internal circuit to serve as a low potential power supply terminal thereof and signal terminals including a group of input terminals and a group of output terminals each connected to said internal circuit, wherein said first power supply terminal is connected to said third power supply terminal through a plurality of switching devices being serially arranged with each other and a resistance, said resistance being coupled between said third power supply terminal and said switching devices, and each of said switching devices is connected to a respective one of said input and output terminals, and each of said switching devices is turned ON and OFF in accordance with the existence of a potential applied to said terminal.

11. A semiconductor device according to claim 10, wherein said switching device comprises MOSFET.

12. A semiconductor device according to claim 11, wherein when all of said switching devices are turned ON, an electric current to be detected flows from said second power supply terminal to said second power supply terminal through said switching device and said resistance.

13. A semiconductor device according to claim 12, wherein said current flowing from said first power supply terminal to said second power supply terminal through said switching devices and said resistance, is detected by conduction test means when test probes are connected to said at least one switching device.

14. A semiconductor device according to claim 13, wherein said conduction test means comprises an ammeter or a DC unit connected between said first power supply terminal and said second power supply terminal.

* * * * *